(12) United States Patent
Cai et al.

(10) Patent No.: US 9,236,545 B2
(45) Date of Patent: Jan. 12, 2016

(54) HYBRID METALLIZATION ON PLASTIC FOR A LIGHT EMITTING DIODE (LED) LIGHTING SYSTEM

(71) Applicant: GE Lighting Solutions LLC, East Cleveland, OH (US)

(72) Inventors: Dengke Cai, Willoughby, OH (US); Gabriel Michael Smith, Cleveland, OH (US); Xiaomei Lou, Solon, OH (US); Koushik Saha, Brunswick, OH (US); Mark J Mayer, Sagamore Hills, OH (US); Peter W Brown, Springboro, OH (US); Tianji Zhao, Highlight Heights, OH (US)

(73) Assignee: GE LIGHTING SOLUTIONS LLC, East Cleveland, OH (US)

( * ) Notice: Subject to any disclaimer, the term of this patent is extended or adjusted under 35 U.S.C. 154(b) by 95 days.

(21) Appl. No.: 14/082,266

(22) Filed: Nov. 18, 2013

(65) Prior Publication Data

US 2015/0138782 A1    May 21, 2015

(51) Int. Cl.
| | |
|---|---|
| H01L 33/60 | (2010.01) |
| F21V 13/08 | (2006.01) |
| G02B 1/04 | (2006.01) |
| G02B 1/10 | (2015.01) |
| C03C 17/36 | (2006.01) |
| G02B 5/08 | (2006.01) |
| F21V 7/22 | (2006.01) |
| F21V 15/01 | (2006.01) |

(Continued)

(52) U.S. Cl.
CPC ............ *H01L 33/60* (2013.01); *C03C 17/3605* (2013.01); *F21V 13/08* (2013.01); *G02B 1/04* (2013.01); *G02B 1/10* (2013.01); *G02B 1/105* (2013.01); *G02B 5/0858* (2013.01); *F21V 7/22* (2013.01); *F21V 15/01* (2013.01); *F21W 2131/103* (2013.01); *F21Y 2101/02* (2013.01); *H01L 2933/0058* (2013.01)

(58) Field of Classification Search
CPC ........ F21V 7/22; C23C 28/00; G02B 5/0808; H01J 61/35; H01K 1/32
See application file for complete search history.

(56) References Cited

U.S. PATENT DOCUMENTS 4,963,012 A * 10/1990 Tracy et al. .................... 359/514
5,201,926 A *  4/1993 Szczyrbowski et al. ....... 65/60.2

(Continued)

FOREIGN PATENT DOCUMENTS

| CN | 201050737 | 4/2008 |
|---|---|---|
| EP | 1720046 | 11/2006 |

(Continued)

*Primary Examiner* — Michael Lebentritt
*Assistant Examiner* — Jordan Klein
(74) *Attorney, Agent, or Firm* — GE Global Patent Operation; Peter T. DiMauro

(57) ABSTRACT

Provided is a multi-layer reflective coating for application to a lighting housing assembly, including a polymer substrate adjacent a polymer base coat layer applied to the lighting housing. Atop the polymer base coat layer is an aluminum adhesion layer, followed by a diffusive barrier layer, and a silver reflective layer. The aluminum adhesion layer promotes adhesion between the polymer base coat layer and the silver reflective layer. The diffusive barrier layer prevents aluminum and silver interaction, which could form a silver and aluminum alloy. A spectrum tunable layer is applied atop the silver reflective layer for spectrum tuning the silver reflective layer for maximum compatibility with a light emitting diode (LED) lighting source.

14 Claims, 2 Drawing Sheets

Structure of protected silver film system

(51) Int. Cl.
*F21W 131/103* (2006.01)
*F21Y 101/02* (2006.01)

(56) References Cited

U.S. PATENT DOCUMENTS

| | | | |
|---|---|---|---|
| 6,078,425 A * | 6/2000 | Wolfe et al. | 359/584 |
| 6,382,816 B1 * | 5/2002 | Zhao et al. | 362/257 |
| 6,773,141 B2 | 8/2004 | Zhao et al. | |
| 7,445,348 B2 * | 11/2008 | Shimada et al. | 359/883 |
| 8,035,285 B2 | 10/2011 | Zhao et al. | |
| 8,064,014 B2 * | 11/2011 | Tatsumi et al. | 349/113 |
| 2002/0154407 A1 * | 10/2002 | Frazier | 359/507 |
| 2006/0072870 A1 * | 4/2006 | Lee et al. | 385/14 |
| 2009/0220802 A1 * | 9/2009 | Faber et al. | 428/446 |
| 2009/0233037 A1 * | 9/2009 | Medwick et al. | 428/68 |
| 2010/0086775 A1 * | 4/2010 | Lairson et al. | 428/336 |
| 2010/0173141 A1 * | 7/2010 | Medwick et al. | 428/220 |
| 2012/0225317 A1 * | 9/2012 | Imran et al. | 428/630 |
| 2012/0287495 A1 * | 11/2012 | McCabe | 359/263 |
| 2013/0003206 A1 * | 1/2013 | Kabagambe et al. | 359/883 |

FOREIGN PATENT DOCUMENTS

| | | |
|---|---|---|
| JP | 06111613 | 4/1994 |
| JP | 4273814 | 6/2009 |

* cited by examiner

Aluminum reflectance vs. Silver

HYBRID METALLIZATION ON PLASTIC FOR A LIGHT EMITTING DIODE (LED) LIGHTING SYSTEM

I. FIELD OF THE INVENTION

The present invention relates generally to lighting assemblies. More particularly, the present invention relates to reflective coatings for outdoor lighting assemblies. The reflective coating described herein is particularly useful with light emitting diodes (LED) assemblies.

II. BACKGROUND OF THE INVENTION

Conventional outdoor or streetlight housing assemblies typically use aluminum-based reflective coatings. Unfortunately aluminum-based reflective coatings have several drawbacks. Firstly, the theoretical reflectance of these coatings in the visible spectrum is about 91%, however the reflectance of an aluminum film with a typical topcoat produced from a coating process is only about 80%. This level of reflectivity is not the highest among available materials.

Secondly, aluminum has poor adhesion to plastic fixtures or basecoats. Polymer basecoats are often required in outdoor lighting assemblies in order to smooth out surfaces and for minimizing roughness and scratches. In conventional outdoor lighting assemblies, a ultra-violet (UV) cured polyimide is applied evenly to the surface of the lighting assembly and a thin film of aluminum is adhesively placed on top of the base coat to create an aluminum/base coat film system. Unfortunately, moisture in air attacks the aluminum/base coat film system, especially in high temperature and high humidity environments. As a result, the aluminum thin film coating deteriorates, and can easily peel off. Therefore, this is not an ideal material for long-term use in an outdoor environment.

It is more desirable to have a highly reflective material (95-100% reflective) that does not have the failings of the aluminum/base coast film system. It is also desirable to have a highly reflective coating that can tolerate the rigors of an outdoor environment. Furthermore, it is desirable to have a reflective material that is offers higher reflective lumens in the visible spectrum when paired with an LED array. Furthermore, it is desirable to have a reflective material this suitable for both indoor and outdoor use with LED arrays.

III. SUMMARY OF EMBODIMENTS OF THE INVENTION

Given the aforementioned deficiencies, a need exists for more reliable and highly reflective coating for housing assemblies for lighting fixtures. More specifically, a need exists for a more highly reflective lighting assembly coating that is more compatible with LED arrays.

Embodiments disclosed herein provide a multi-layer reflective coating for application to a lighting housing assembly, multi-layer reflective coating for application to a lighting housing assembly, comprising an aluminum adhesion layer applied atop a polymer base coat layer. Adjacent the aluminum adhesion layer is a diffusive barrier layer applied atop the aluminum adhesion layer. A silver reflective layer is applied atop the diffusive barrier layer. Therein, the aluminum adhesion promotion layer promotes adhesion between the polymer base coat layer and the silver reflective layer. Furthermore, a spectrum tunable layer is applied atop the silver reflective layer for spectrum tuning the reflective layer for maximum compatibility with a Light Emitting Diode lighting source as well as, for protecting the silver reflective layer from the elements.

The embodiments herein, further comprising a polymer substrate layer below the polymer base coat layer, wherein the polymer substrate layer comprises a ultra-violet cured polyimide that can be applied to plastic, glass or metal. The aluminum adhesion promotion layer comprises a 1-10 nanometer (nm) thick Aluminum (Al) film. The diffusive barrier layer comprises a 50-100 nm thick film of nickel and chromium (NiCr or Ni and Cr). The silver reflective layer comprises 100-400 nm thick silver (Ag) film. Atop the spectrum tunable layer comprises a 100-300 nm metal oxide based film.

The embodiments herein further provide a diffusive barrier layer is applied atop the adhesion promotion layer for preventing the formation of an Al2Ag alloy. This alloy can form due to the migration of atoms from the aluminum adhesion layer with atoms from the reflective layer.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

IV. BRIEF DESCRIPTION OF THE DRAWINGS

The accompanying drawings, which are incorporated herein and form part of the specification, illustrate the present invention and, together with the description, further serve to explain the principles of the invention and to enable a person skilled in the relevant art(s) to make and use the invention.

V. DETAILED DESCRIPTION OF EMBODIMENTS OF THE INVENTION

While the present invention is described herein with illustrative embodiments for particular applications, it should be understood that the invention is not limited thereto. Those skilled in the art with access to the teachings provided herein will recognize additional modifications, applications, and embodiments within the scope thereof and additional fields in which the invention would be of significant utility.

Figure 1:
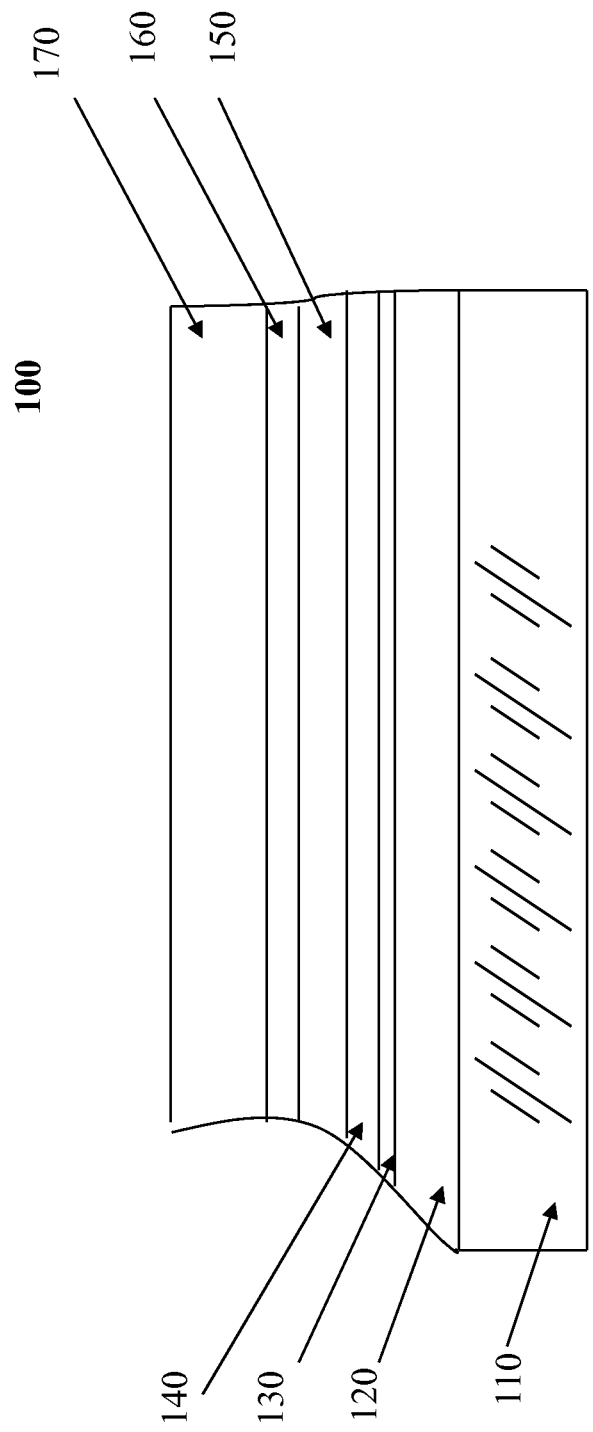
FIG. 1 is a cross section illustration of a multi-layer reflective coating according to an embodiment.

FIG. 1 is an illustration of a multi-layer reflective coating 100 according to an embodiment. The multi-layer reflective coating 100 comprises a number of layers. In an exemplary embodiment, the multi-layer reflective coating can comprise at least seven layers, these layers including a polymer substrate layer 110, a polymer basecoat layer 120, aluminum (Al) adhesive layer (130), a diffusive barrier layer 140, a silver (Ag) reflective layer 150, a spectrum tunable layer 160 and a protective top coat layer 170. The polymer substrate layer (110) comprises a ultra-violet cured polyimide.

Sitting atop the polymer substrate layer 110 is a polymer basecoat layer 120. Above the base coat layer 120 is an aluminum adhesive layer 130. Next is a diffusive barrier layer 140, which can be comprised of Nickel Chromium or Nickel (Ni) and Chromium (Cr). Next is a silver reflective layer 150.

A metal oxide based film that provides a spectrum tunable layer 160 protects the silver reflective layer 150. Finally, a protective topcoat layer 170 comprising a transparent organic or inorganic-organic hybrid coating for protecting the silver reflective layer 150 is applied.

The multi-layer reflective coating 100 comprises a polymer substrate layer 110. The polymer substrate layer 110 is a substrate material that can be applied to plastic, glass or metal. The polymer substrate layer 110 is comprised of an ultra-violet cured polyimide that is sprayed onto the material comprising the lighting assembly housing so that the surface of the lighting assembly housing material can be smoothed to minimize roughness, scratches, etc.

The polymer substrate layer 110 essentially servers as a "primer" layer for prepping the lighting assembly housing to receive the various layers of the multilayer reflective coating 100. The polymer substrate 110 may be applied to a variety of materials including glass, metals, plastics and other polycarbonates. The polymer substrate and other layers can be cured via a UV process, a vacuum process, a deposition process, a laminate process, and/or a metallization process. Once the polymer substrate layer 110 has been applied to the housing and cured, the other layers are then applied.

Once the polymer substrate layer 110 has been cured, a polymer base coat (BC) layer 120 can be applied. The base coat layer 120 increases the ability of other materials to adhere to the polymer substrate layer 110, while also providing a consistently smooth surface for the reflective layers that adhere to it. The base coat layer 120 is needed because most housing materials used in lighting products such as plastics and other polycarbonates also do not provide a smooth surface.

The resulting smooth surface that is created after the base coat layer 120 is applied provides a better, more evenly dispersed beam reflectance for the other reflective layers. Having a base coat layer 120 also provides improved adhesion between reflective metal materials and the plastic substrate. The base coat layer 120 can be applied, for example, using a spray coating process and is typically UV cured.

The materials used in the polymer substrate 110 and polymer base coat 120 layers may have poor reflectance properties. When aluminum serves as reflective coating in prior art, it may have poor adhesion to the basecoat or a plastic substrate. Silver may also have some difficulty adhering to basecoat materials. Therefore, a thin Aluminum adhesion layer 130 is placed atop the base coat 120 layer.

However, the aluminum adhesion layer 130, is a very thin layer of aluminum, so thin in fact, it may not comprise a continuous layer that covers the basecoat entirely. In an embodiment, the aluminum adhesion layer 130 a perforated film or more like "islands of aluminum" that work together with the next adjacent diffusive barrier layer 140 to form a relatively strong bond to the basecoat. The aluminum adhesion layer 130 is made by vacuum coating and UV curing process, a very thin aluminum film or other metallic material is used as an adhesive layer for aiding silver coating adhesion to substrate or basecoat. The thickness of this layer is from several nanometers (nm) to several tens of nanometers.

The aluminum adhesion layer 130 further improves the stability of the multi-layer reflective coating 100 by reducing internal stress between the various layers while providing a surface that the silver reflective layer 150 can adhere too. Unfortunately however, in conventional systems, moisture in the ambient environment attacks the aluminum/basecoat film, especially in high temperature and high humidity environmental conditions. As a result, the aluminum thin film coating comprising the aluminum adhesion 130 layer deteriorates and can easily peel off. Therefore, a fourth layer is needed to protect the aluminum adhesion 130 layer.

A fourth layer is added to the multi-layer reflective coating 100 to both protect the aluminum adhesion layer 130 from the elements, while also creating a diffusive barrier layer 140. This fourth layer creates a diffusive barrier layer 140 for preventing migration from the aluminum found in the aluminum adhesion layer 130 to the silver (Ag) found in the silver reflective layer 150.

When aluminum (Al) and silver (Ag) metals are placed in direct contact with each other, there is a tendency for atoms from each metal to interact or migrate, which can result in the formation of an Ag2Al alloy. Unfortunately, this Ag2Al alloy has very poor reflective properties and is not desirable for this application. Therefore, the diffusive barrier layer 140, is used to prevent atom migration between these two metals. In an embodiment, the diffusive barrier layer 140 is comprised of a Nickel Chromium (NiCr) layer or layers of Nickel (Ni) and Chromium (Cr).

The Ni and Cr components enhance Silver (Ag) bonding to the Aluminum adhesion layer 130, the base coat layer 120 and the polymer substrate layer 110. Furthermore, the diffusive barrier layer 140 also prevents the formation an Ag2Al alloy during the vacuum deposition or curing of these layers. In an embodiment, the NiCr or Ni and Cr diffusive barrier is 50-100 nm thick. The NiCr alloy and/or Ni and Cr materials do not react with the silver material.

In an exemplary embodiment, a NiCr alloy comprising at least 20% Ni and 80% Cr to an alloy having at least 80% Ni and 20% Cr can be used. The diffusive barrier layer 140 can be applied, for example, using a vacuum deposition process.

In a further embodiment, above the polymer substrate layer 110, base coat layer 120, aluminum adhesive layer 130, and diffusive barrier layer 140, is the silver (Ag) reflective layer 150. Silver thin film coating has a higher reflectance than aluminum (Al). In fact, with a light reflectance of 95-98%, silver has a higher reflectance than all other metals.

In the exemplary embodiment, this silver reflective layer 150 improves the lumens per Watt (LPW) output of a lighting housing assembly by 10-15% or more. Furthermore, silver has the lowest polarization splitting compared to any other metal. This characteristic also benefits the beam pattern reflectance and simplifies the coating process. The coating process is simplified because no extra work is required to get high reflectivity due to the polarization characteristics of silver. In fact, silver has the least polarization of any metal in this application.

Replacing Al with Ag in the lighting housing has several advantages. In an embodiment, the silver reflective layer 150 is comprised of a 150-400 nm thick silver reflective layer. The silver reflective layer 150 is thicker than the other layers to improve stability of the multi-layer reflective coating 100. In addition, due to blue absorption of silver compared with aluminum coating, it minimizes the influence from correlated color temperature system (CCT).

This higher color absorption property of silver provides for better performance for light emitting diode applications. Furthermore, due the similarities between silver and aluminum the impact on manufacturing costs in switching between these two metals is minimal. The silver reflective layer 150 can be applied, for example, using a vacuum deposition process.

Similar to aluminum, silver requires a protective top coat to protect it from the elements and to keep it from tarnishing as it interacts with moisture, humidity, oxygen and the ambient environment. Conventional base coat and top coat materials that work fine for aluminum do not work as well for silver.

Thus, the silver reflective layer 150 requires a special interface layer between the UV cured acrylate topcoat layer 170.

Above the silver reflective layer 150 is a transparent is a protective material called a spectrum tunable layer 160. The spectrum tunable layer 160, may be comprised of, for example, a metal oxide based film. The silver film coating needs this special spectrum tunable layer 160 between silver reflective layer 150 and the polymer topcoat layer 170 as protective layer for the silver film. This spectrum tunable layer 160 on top of the silver thin film coating can protect the silver layer from silver tarnishing, which can be caused by moisture, oxygen molecules or oxygen atoms attacking the silver.

Furthermore, since silver has a tendency to tarnish once exposed to the elements, one method of protecting against this tarnishing is the application of the combination of the spectrum tunable layer 160 and a top coat layer 170. Shortly after a silver vacuum deposition process is used to apply the silver reflective layer 150 to the lighting housing, this spectrum tunable layer 160 can be coated on to the silver reflective layer 150 as a thin film using a vacuum deposition process or a laminate process and UV curing.

The materials used to create this spectrum tunable layer 160 can be comprised of organic or inorganic-organic hybrid coating materials. These organic or inorganic-organic hybrid materials can comprise silicon dioxide, silica monoxide, silica nitride, metal oxide and metal nitrides. The glass transition temperatures of these materials are 20 degrees Celsius higher than the maximum operation temperature of the silver reflective layer 150. In an embodiment, this spectrum tunable layer is 100-300 nm thick.

The silver reflective layer 150 requires a special topcoat to protect it from tarnishing once it is exposed to the elements. A topcoat layer 170 is applied above the spectrum tunable layer 160 and silver reflective layer 150. The topcoat layer 170 is applied using a spray coating or laminate process and is typically UV cured. The topcoat layer 170 can be formed of organic or inorganic-organic hybrid coating layers for additional silver protection.

These organic or inorganic-organic hybrid materials can comprise acrylate, polyester and silicone. Similar to the spectrum tunable layer 160, the glass transition temperatures of these materials are 20 degrees Celsius higher than the maximum operation temperature of the silver reflective 150 layer.

In one embodiment, in order to minimize the internal stress from the UV curable base coating and top coating, the thickness of the base coat layer 120 is less than the thickness of the topcoat layer 170. Also, after UV curing on the base coat layer 120 and top coat layer 170, additional thermal curing processes may be used to fully polymerize the base coat layer 120 and top coat layer 170.

Further, after the polymer substrate layer 110 and topcoat layers 170 have been UV cured, additional thermal curing processes may be invoked to fully polymerize the polymer substrate 110 and top coat layers 170. The layers can be cured via a UV process, a vacuum process, a deposition process, a laminate process, and/or a metallization process.

In an alternative embodiment, a 50 nm-3000 nm thick layer of enhanced aluminum may be used for the silver reflective layer 150 instead of silver. Enhanced aluminum is a very tough material and may be more desirable for high temperature or very low temperature applications. Enhanced aluminum has very high light reflectivity in the range of 96%-98%. However, enhanced aluminum process is more complicated than that of silver, because more thin film layers are involved. Enhanced aluminum coatings have the same or similar reflectance in the visible spectrum as silver.

Although, enhanced aluminum may not require a top coat, in an exemplary embodiment, enhanced aluminum uses a multilayer coating on top of polymer substrate 110. An example of such an enhanced Al coating, is a 26 multi-layer alternating silica and niobium oxides, made by thin film vacuum deposition process. These enhanced oxide layers are the preferred topcoats to protect Al from being affected by moisture. Enhanced aluminum is to use some thin film material deposited on top of aluminum layer to increase aluminum reflectance.

Enhanced aluminum design can be as simple as having only one thin film layer coating on top of aluminum layer, or it may have as many as several tens of alternating high and low refractive thin film materials depending on the design goal. As an example, an enhanced aluminum having about twenty to thirty high and relatively low index thin film coatings can have a 98% reflectance, which is equivalent to silver in reflectivity.

A typical enhanced aluminum process is vacuum coating process, in which, each enhanced aluminum layer on top of pre-coated aluminum, will be coated in a vacuum chamber. The layer composition, thickness, and other characteristics will be well controlled by the coating process. For example, coating time, or using more advanced optical or crystal-monitoring controls can control the layer thickness. Coating temperature, pressure and bias different gases used during the coating process are used to secure the coating composition and quality.

Figure 2:
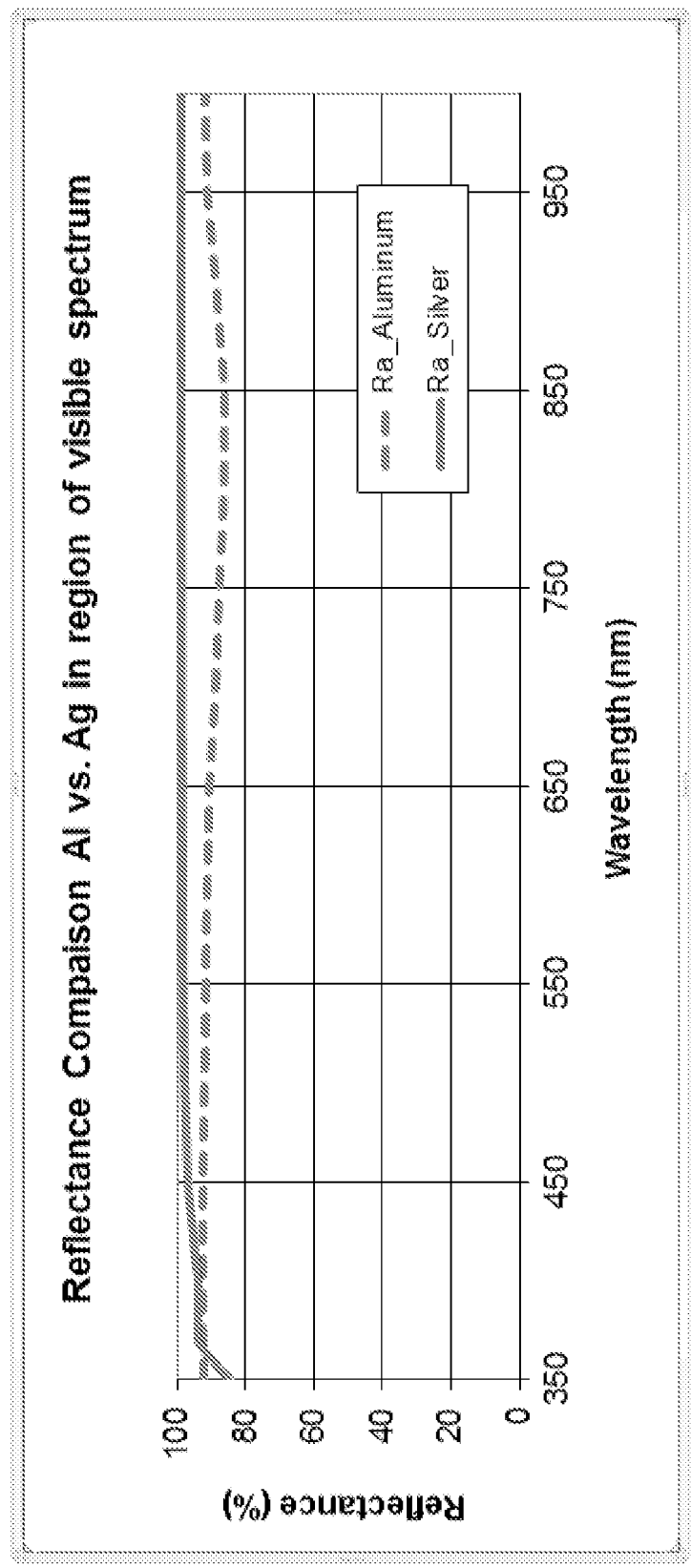
FIG. 2 is a spectrum comparison of the aluminum reflective layer versus the silver reflective layer according to an embodiment.

Turning now to FIG. 2, is a chart illustrating the reflectance comparison of aluminum versus silver in the region of the visible spectrum. The two reflection curves in the chart, shows aluminum vs. silver in the same spectrum range, which is the visible spectrum from 350 to 1000 nm.

However, most humans can only see light in the visible spectrum from 380 to 780 nm. Silver has higher reflectance in the spectrum, only towards short wave, probably less than 380 nm. Aluminum however, has little higher reflectivity over a broader spectrum from 380 nm to 1000 nm. The average luminous reflectance of aluminum is about 90% while silver has 97%. Due to the multi-bounce of light from an LED or a halogen light in the lamp fixture, an increase in lumen reflectivity of 10 to 20% for silver coating is expected.

CONCLUSION

The present invention has been described above with the aid of functional building layers illustrating the implementation of specified functions and relationships thereof. The boundaries of these functional layers have been arbitrarily defined herein for the convenience of the description. Alternate boundaries can be defined so long as the specified functions and relationships thereof are appropriately performed.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

What is claimed is:

1. A multi-layer reflective coating for application to a lighting housing assembly, comprising:
   an aluminum adhesion promotion layer applied atop a polymer base coat layer, wherein the aluminum adhesion promotion layer comprises a 1-10 nanometer (nm) thick Aluminum (Al) film;

a diffusive barrier layer applied atop the aluminum adhesion promotion layer, wherein the diffusive barrier layer comprises a 50-100 nm thick film of NiCr or Ni and Cr;

a reflective layer applied atop the diffusive barrier layer, wherein the reflective layer comprises 100-400 nm thick silver (Ag) film;

wherein the aluminum adhesion promotion layer promotes adhesion between the polymer base coat layer and the reflective layer; and a spectrum tunable layer applied atop the reflective layer for spectrum tuning the reflective layer to be used with a light emitting diode lighting source.

2. The multi-layer reflective coating of claim 1, further comprising a polymer substrate layer below the polymer base coat layer, wherein the polymer substrate layer comprises a ultra-violet cured polyimide that can be applied to plastic, glass or metal.

3. The multi-layer reflective coating of claim 1, wherein the diffusive barrier layer is applied atop the aluminum adhesion promotion layer for preventing the formation of an Al2Ag alloy due to the migration of atoms from the aluminum adhesion layer with atoms from the silver film of the reflective layer.

4. The multi-layer reflective coating of claim 1, wherein the spectrum tunable layer comprises a 100-300 nm metal oxide based film.

5. The multi-layer reflective coating of claim 4, wherein the metal oxide based film is selected from a group comprising Titanium Oxide (TiO2), Silicon Dioxide (SiO2) or Tantalum Pentoxide (Ta2O5) or combination of these metal oxide films.

6. The multi-layer reflective coating of claim 1, wherein a protective top layer comprising a transparent organic or inorganic-organic hybrid coating is applied atop the spectrum turntable layer as well as the combined previous layers as a protective coating.

7. A method of creating a multi-layer reflective coating, the method comprising:

applying an aluminum adhesion promotion layer atop a polymer base coat layer, wherein the aluminum adhesion promotion layer comprises a 1-10 nanometer (nm) thick Aluminum (Al) film, applying a diffusive barrier layer atop the aluminum adhesion promotion layer, wherein the diffusive barrier layer comprises a 50-100 nm thick film of NiCr or Ni and Cr;

applying a reflective layer applied atop the diffusive barrier layer, wherein the reflective layer comprises 200-400 nm thick Silver (Ag) film;

wherein the aluminum adhesion promotion layer promotes adhesion between the polymer base coat layer and the reflective layer; and applying a spectrum tunable layer atop the reflective layer for spectrum tuning the reflective layer to be used with a Light Emitting Diode lighting source.

8. The method of creating a multi-layer reflective coating of claim 7, further comprising a polymer substrate layer below the polymer base coat layer, wherein the polymer substrate layer comprises a ultra-violet cured polyimide that can be applied to plastic, glass or metal.

9. The method of creating a multi-layer reflective coating of claim 7, wherein the diffusive barrier layer is applied atop the aluminum adhesion promotion layer for preventing the formation of an Al2Ag alloy due to the migration of atoms from the aluminum adhesion layer with silver atoms forming the reflective layer.

10. The method of creating a multi-layer reflective coating of claim 7, wherein the spectrum tunable layer comprises a 100-300 nm thick metal oxide based film, the metal oxide based film is selected from a group comprising Titanium Oxide (TiO2), Silicon Dioxide (SiO2) or Tantalum Pentoxide (Ta2O5) or combination of these metal oxide films.

11. The method of creating a multi-layer reflective coating of claim 7, wherein the spectrum tunable layer comprises a 100-300 nm thick silicon nitride, or any other kind of nitride, fluoride, or sulfide, or combination of these metal oxide films.

12. The method of creating a multi-layer reflective coating of claim 10 or 11, wherein the spectrum tunable layer serves also as protective layer for the silver reflective layer.

13. The method of creating a multi-layer reflective coating of claim 7, wherein a protective top layer comprising a transparent organic or inorganic-organic hybrid coating is applied atop the spectrum turntable layer as well as the combined previous layers as a protective coating.

14. A method of creating a multi-layer reflective coating for a light emitting diode housing assembly, the method comprising:

vacuum coating an aluminum adhesion promotion layer atop a polymer base coat layer, wherein the aluminum adhesion promotion layer comprises a 1-10 nanometer (nm) thick Aluminum (Al) film;

vacuum coating a diffusive barrier layer atop the aluminum adhesion promotion layer, wherein the diffusive barrier layer comprises a 50-100 nm thick film of NiCr or Ni and Cr;

using vacuum deposition to deposit a silver reflective layer atop the diffusive barrier layer, wherein the silver reflective layer comprises 200-400 nm thick Silver (Ag) film;

wherein the aluminum adhesion promotion layer promotes adhesion between the polymer base coat layer and a silver reflective layer; and wherein the diffusive barrier layer is applied atop the aluminum adhesion promotion layer for preventing the formation of an Al2Ag alloy due to the migration of atoms between the aluminum adhesion layer and the silver reflective layer; and vacuum coating a spectrum tunable layer applied atop the silver reflective layer for spectrum tuning the silver reflective layer to be used with a Light Emitting Diode lighting source.

* * * * *